United States Patent
Chen et al.

(10) Patent No.: US 9,330,846 B2
(45) Date of Patent: May 3, 2016

(54) CAPACITOR STRUCTURE OF CAPACITIVE TOUCH PANEL

(71) Applicant: E Ink Holdings Inc., Hsinchu (TW)

(72) Inventors: Wei-Tsung Chen, Hsinchu (TW);
Ted-Hong Shinn, Hsinchu (TW);
Chuang-Chuang Tsai, Hsinchu (TW);
Wen-Chung Tang, Hsinchu (TW);
Chih-Hsiang Yang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 291 days.

(21) Appl. No.: 13/920,096

(22) Filed: Jun. 18, 2013

(65) Prior Publication Data

US 2014/0071588 A1 Mar. 13, 2014

(30) Foreign Application Priority Data

Sep. 7, 2012 (TW) ................ 101132861 A

(51) Int. Cl.
*H01G 4/12* (2006.01)
*H01L 49/02* (2006.01)
*G06F 3/044* (2006.01)

(52) U.S. Cl.
CPC .............. *H01G 4/1272* (2013.01); *G06F 3/044* (2013.01); *H01L 28/40* (2013.01)

(58) Field of Classification Search
CPC ............................... H01G 4/1272; H01G 4/20
USPC .......................................... 361/313; 200/600
See application file for complete search history.

(56) References Cited

U.S. PATENT DOCUMENTS

| | | | | |
|---|---|---|---|---|
| 3,411,053 A * | 11/1968 | Wiesner | .................. | 257/296 |
| 4,152,597 A * | 5/1979 | Sher | ................... | 250/370.01 |
| 4,250,384 A * | 2/1981 | Pulvari | ................... | 250/330 |
| 4,603,258 A * | 7/1986 | Sher et al. | ........... | 250/370.08 |
| 5,126,921 A * | 6/1992 | Fujishima et al. | ........ | 361/525 |
| 7,790,487 B2 | 9/2010 | Shih et al. | | |
| 8,111,344 B2 | 2/2012 | Moon et al. | | |
| 2007/0030623 A1 * | 2/2007 | Clemens et al. | .......... | 361/281 |
| 2010/0155731 A1 | 6/2010 | Sun et al. | | |
| 2010/0315377 A1 | 12/2010 | Chang et al. | | |
| 2011/0099805 A1 * | 5/2011 | Lee | .............................. | 29/846 |
| 2011/0261017 A1 | 10/2011 | Park et al. | | |
| 2011/0272689 A1 | 11/2011 | Park et al. | | |
| 2012/0007988 A1 | 1/2012 | Ikeda et al. | | |
| 2012/0064664 A1 | 3/2012 | Yamazaki et al. | | |
| 2012/0113341 A1 * | 5/2012 | Uochi | ............................ | 349/38 |
| 2013/0100077 A1 * | 4/2013 | Chung | ................ | G06F 3/042 345/175 |
| 2014/0008761 A1 * | 1/2014 | Ye | ................................ | 257/532 |
| 2014/0027261 A1 * | 1/2014 | Yeh et al. | ................ | 200/600 |

FOREIGN PATENT DOCUMENTS

CN    201600673    10/2010

OTHER PUBLICATIONS

Office Action of China Counterpart Application, issued on Jan. 14, 2016, p. 1-p. 8.

* cited by examiner

*Primary Examiner* — David M Sinclair
(74) *Attorney, Agent, or Firm* — Jianq Chyun IP Office

(57) ABSTRACT

A capacitor structure of capacitive touch panel including a first electrode layer, a first material layer, a second material layer and a second electrode layer is provided. The first material layer is disposed on the first electrode layer, and the material of the first material layer is selected from one of a semiconductor material and an insulating material. The second material layer is disposed on the first material layer, and the material of the second material layer is selected from another one of the semiconductor material and the insulating material. The second electrode layer is disposed on the second material layer.

8 Claims, 3 Drawing Sheets

CAPACITOR STRUCTURE OF CAPACITIVE TOUCH PANEL

CROSS-REFERENCE TO RELATED APPLICATION

This application claims the priority benefit of Taiwan application serial no. 101132861, filed on Sep. 7, 2012. The entirety of the above-mentioned patent application is hereby incorporated by reference herein and made a part of this specification.

BACKGROUND OF THE INVENTION

1. Field of the Invention

The invention generally relates to a component structure of touch panel, and more particularly, to a capacitor structure of capacitive touch panel.

2. Description of Related Art

Along with the development of touch panels, the touch panel has been broadly applied in the screens of electronic apparatuses such as mobile phone, notebook or tablet computer. The touch panel enables a user more conveniently inputting or manipulating with the electronic apparatuses and makes the user interface more user-friend and easily to operate.

In general, the touch panel can be divided into resistive touch panel, capacitive touch panel, acoustic touch panel, optical touch panel or electromagnetic touch panel according to the structure and sensing method thereof. For a capacitive touch panel, the electrode structure thereof includes a plurality of receiving electrodes and a plurality of driving electrodes. In the application practice, the driving electrode is configured to receive the driving signal input by the panel so that the touch panel is driven to sense the touching action of the user. The receiving electrode is configured to produce a sensed signal corresponding to the touching action of the user. However, the capacitive touch panel today is adapted only to the direct touching action of the user, but unable to work for using remote operation way or non-touch operation way.

In addition, in terms of an optical touch panel, although it can work by using remote operation way or non-touch operation way, but the current optical touch panel mostly adopts a built-in architecture, i.e., the optical sensor is directly buried on a thin film transistor (TFT) panel or a color filter panel (CFP), which must occupies a certain area of pixels and affects the aperture ratio of the panel.

SUMMARY OF THE INVENTION

Accordingly, the invention is directed to a capacitor structure of capacitive touch panel, which has both the capacitive touch function and optical touch function.

The invention provides a capacitor structure of capacitive touch panel, which includes a first electrode layer, a first material layer, a second material layer and a second electrode layer. The first material layer is disposed on the first electrode layer, and the material of the first material layer is selected from one of a semiconductor material and an insulating material. The second material layer is disposed on the first material layer, and the material of the second material layer is selected from another one of the semiconductor material and the insulating material. The second electrode layer is disposed on the second material layer.

In an embodiment of the present invention, the material of the above-mentioned second material layer is selected from semiconductor material and a width on a first direction of the second electrode layer disposed on the second material layer is less than a width on the first direction of the second material layer.

In an embodiment of the present invention, the above-mentioned second electrode layer is arranged on the first direction.

In an embodiment of the present invention, the material of the above-mentioned first material layer is selected from semiconductor material and a width on a second direction of the first electrode layer disposed under the first material layer is less than a width on the second direction of the first material layer.

In an embodiment of the present invention, the above-mentioned first electrode layer is arranged on the second direction.

In an embodiment of the present invention, the above-mentioned semiconductor material is a metal oxide semiconductor (MOS).

In an embodiment of the present invention, during an irradiation, a capacitor of depletion region of the first material layer or second material layer made of semiconductor material is produced according to a bias of the capacitor structure.

In an embodiment of the present invention, during the irradiation, a light source provides the capacitor structure with a light and a flashing frequency of the light source is greater than a threshold frequency.

In an embodiment of the present invention, the above-mentioned first electrode layer and second electrode layer are configured to receive an AC signal to be operated in a periodic polarity-reversal mode.

Based on the depiction above, in the embodiments of the invention, the semiconductor material layers of the touch panel have two touch controls of optical triggering and finger touch triggering and therefore the capacitive touch panel of the disclosure has both the capacitive touch function and the optical touch function.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

The capacitive touch panel of the disclosure is similar to the hardware architecture of the conventional capacitive touch panel and is able to realize at least both the capacitive touch function and the optical touch function. In comparison with the conventional capacitive touch panel, the capacitive touch panel of the disclosure has an additional semiconductor layer so that the process of the capacitive touch panel of the disclosure is not much different from the process of the conventional one. The material selection of the semiconductor layer must take the transparency in consideration. In fact, the critical consideration criteria is that the band-gap of the material must be greater than or slightly less than the photon energy of the visible light. During the optical touching operation, an AC signal can be directly produced on the touch panel or added into the received light. When the semiconductor layer absorbs the light from the touch panel or the ambient, the light with modulation is helpful to interpretation of the touch panel. For better understanding the invention, an embodiment in association with figures are explained in following.

Figure 1:
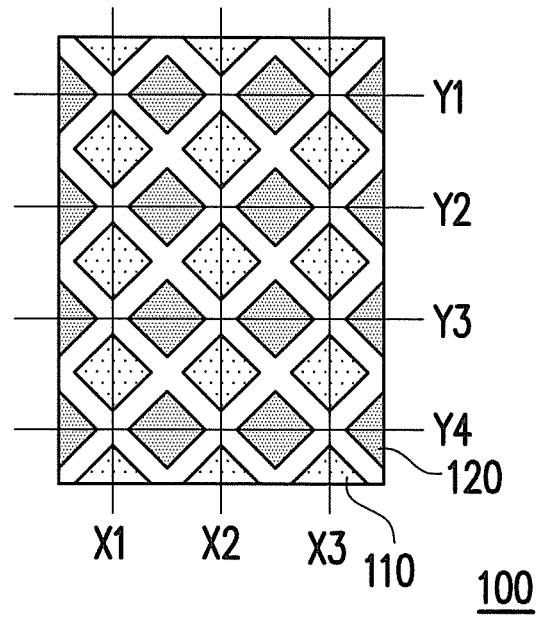
FIG. 1 is a top-view diagram of an electrode structure of a capacitive touch panel according to an embodiment of the invention.

FIG. 1 is a top-view diagram of an electrode structure of a capacitive touch panel according to an embodiment of the invention. Referring to FIG. 1, a capacitive touch panel 100 with a set of 3×4 electrodes is given. The capacitive touch panel 100 has two regions: a driving region including a plurality of driving electrodes 110 and a receiving region including a plurality of receiving electrodes 120. Within the driving region, the same columns X1-X3 respectively have four driving electrodes 110 in quadrilateral shapes. Within the receiving region, the same rows Y1-Y4 respectively have three receiving electrodes 120 in quadrilateral shapes. It should be noted that the rows and columns herein are defined referring to the array direction of FIG. 1 and the terminologies of column and row are to describe, not to limit, the invention.

Figure 2:
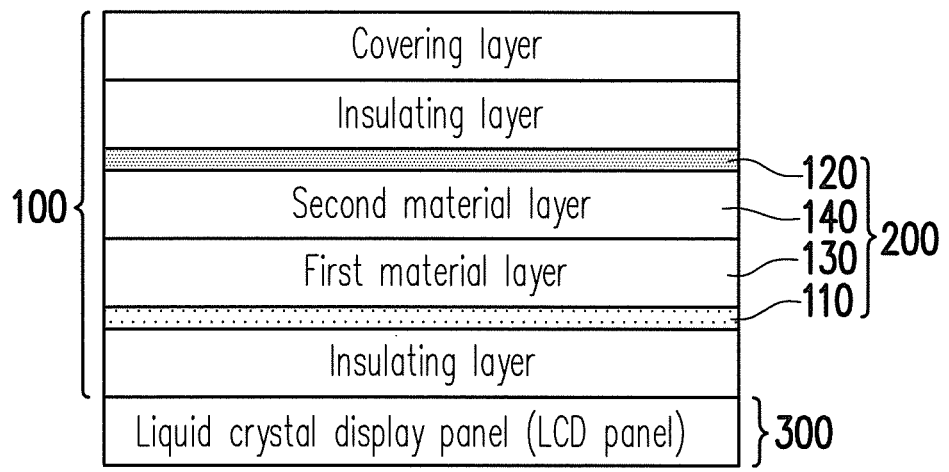
FIG. 2 is a cross-sectional diagram of the capacitor structure of the capacitive touch panel in the embodiment of FIG. 1.

FIG. 2 is a cross-sectional diagram of the capacitor structure of the capacitive touch panel in the embodiment of FIG. 1. Referring to FIGS. 1 and 2, the capacitive touch panel 100 in the embodiment includes a plurality of staggered connected capacitor structures 200 and the cross-sectional diagram thereof is shown by FIG. 2. The capacitor structure 200 serves as a portion of the capacitive touch panel 100 and is disposed on an LCD panel 300 so as to execute touching and sensing functions together with the LCD panel 300.

In more details, the capacitor structure 200 of the embodiment includes a first electrode layer 110, a first material layer 130, a second material layer 140 and a second electrode layer 120. The first material layer 130 is disposed on the first electrode layer 110, and the material of the first material layer 130 is selected from one of a semiconductor material and an insulating material. The second material layer 140 is disposed on the first material layer 130, and the material of the second material layer 140 is selected from another one of the semiconductor material and the insulating material. The second electrode layer 120 is disposed on the second material layer 140. In the embodiment, the material of the first material layer 130 is semiconductor material which includes metal oxide semiconductor (MOS), for example, indium gallium zinc oxide (IGZO) or hafnium indium zinc oxide (HIZO), which the invention is not limited to. In another embodiment, the first material layer 130 is made of semiconductor material and the second material layer 140 is made of insulating material. In other words, one of schemes of the disclosure rests in that the two electrode layers include not only insulating layer, but also semiconductor layer. Therefore, the stacking sequence of the insulating layer and the semiconductor layer are not to limit the invention and different stacking sequence does not affect the electrical characteristic of the capacitor structure of capacitive touch panel. In the embodiment, the first electrode layer 110 and the second electrode layer 120 are made of, for example, a transparent semiconductor of indium tin oxide (ITO), which the invention is not limited to.

In following, the second material layer 140 is, for example, a semiconductor layer to explain the operation principle of the disclosure. In the embodiment, the second material layer 140 can form a depletion region under an appropriate bias and the depletion region is just like an insulating layer under a voltage with some AC frequencies. In other words, an applied appropriate bias depending on the application practice enables the second material layer 140 producing a capacitor Cs of the depletion region and the whole capacitance of the capacitor structure 200 is the result in series connection of a capacitor Cox of the insulating layer and the capacitor Cs of the depletion region. In addition, the another feature of the second material layer 140 is it can absorb photons of visible light or ultraviolet (UV) to produce electron-hole pairs. The electrons and the holes are separated by an electrical field in the depletion region to produce a new electrical field so as to make the energy band structure of the second material layer 140 even. That is to say, the irradiation can eliminate the depletion region of the second material layer 140 so as to eliminate the capacitor Cs of the depletion region. In the embodiment, the whole capacitances of the capacitor structure 200 before and after the irradiation has a difference of a capacitance Cs of the depletion region therebetween. When the material of the second material layer 140 in the capacitor structure 200 is metal oxide semiconductor (MOS) of indium gallium zinc oxide (IGZO), for the capacitor structures 200 respectively with depletion region (at the time, Cox and Cs is in series connection) and without the depletion region (at the time, there is Cox only), the difference of the whole capacitances can be four times, i.e., 4:1. In this way, the capacitor structure 200 of the embodiment can provide sufficient capacitance variation for distinguishing the states of the touch panel 100.

Figure 3:
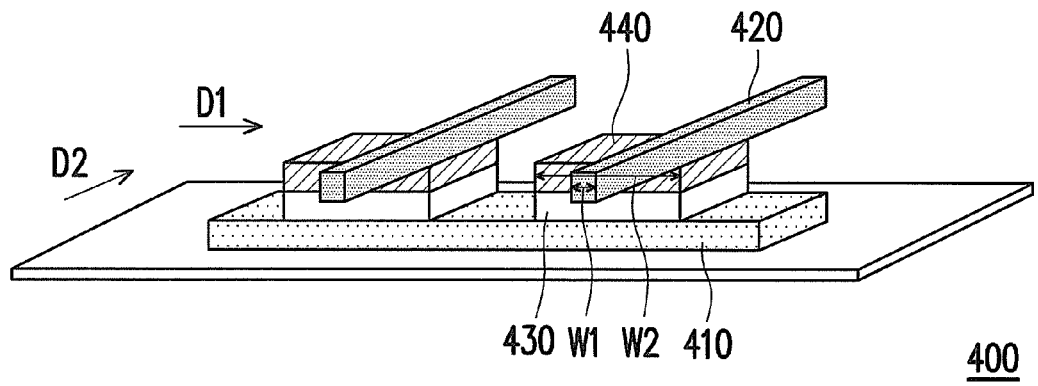
FIG. 3 is a three-dimensional diagram of a capacitor structure of a capacitive touch panel according to another embodiment of the invention.
Figure 4:
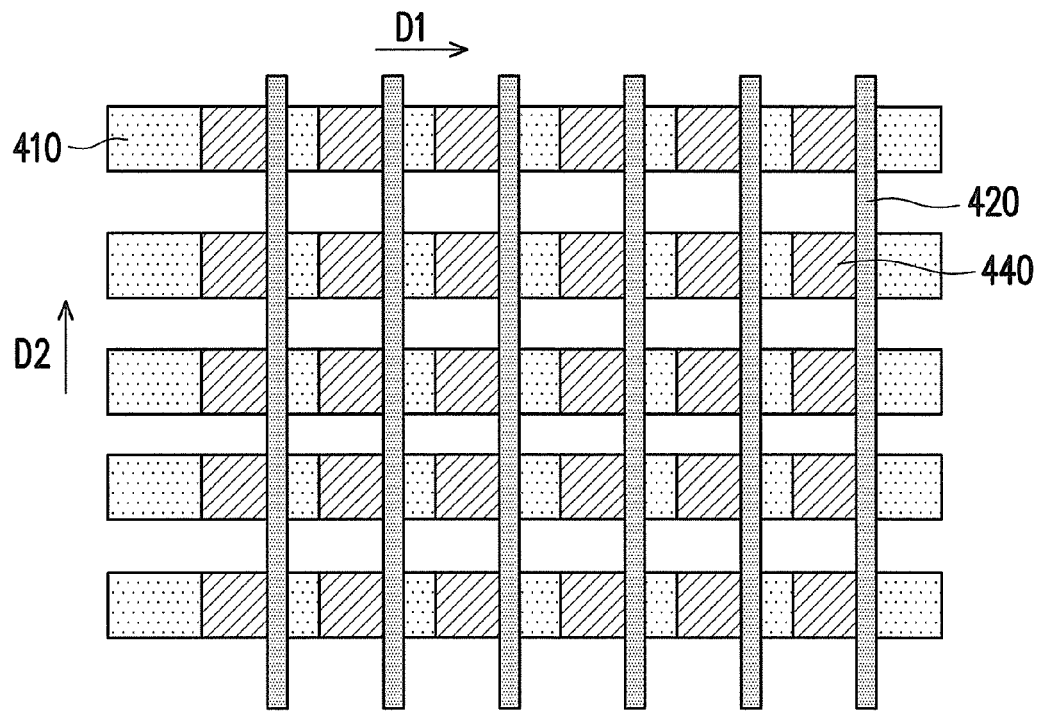
FIG. 4 is a top-view diagram of the capacitor structure of the capacitive touch panel in the embodiment of FIG. 3.

FIG. 3 is a three-dimensional diagram of a capacitor structure of a capacitive touch panel according to another embodiment of the invention and FIG. 4 is a top-view diagram of the capacitor structure of the capacitive touch panel in the embodiment of FIG. 3. Referring to FIGS. 3 and 4, each of a plurality of capacitor structures 400 of the embodiment at least includes a first electrode layer 410, a first material layer 430, a second material layer 440 and a second electrode layer 420, in which the stacking relations between the structure layers are shown by FIG. 3, which is omitted to describe. In the embodiment, the second material layer 440 is a semiconductor layer arranged on the first direction D1, while the first material layer 430 is an insulating layer arranged on the second direction D2. For simplicity, in FIG. 3, only one first material layer 430 is shown and the arrangement thereof on the second direction D2 is analogy to the arrangement of the second material layer 440 on the first direction D1.

In the embodiment, in each of the capacitor structures 400 of the touch panel 100, the second material layer 440 and first material layer 430 are sandwiched by the first electrode layer 410 and the second electrode layer 420. The second electrode layer 420 contacts, but not necessarily entire contacts, the second material layer 440. In other words, the width W1 on the first direction D1 of the second electrode layer 420 disposed on the second material layer 440 is less than the width W2 on the first direction D1 of the second material layer 440, which the invention is not limited to. In other embodiments, the second electrode layer 420 can entire contact the second material layer 440 and at the time, the width W1 is equal to the width W2. In the design where the width W1 is less than the width W2, the MOS semiconductor is easier to be processed.

In another embodiment, the first material layer 430 is a semiconductor layer, while the second material layer 440 is an insulating layer. With the implementation, the width on the second direction D2 of the first electrode layer 410 disposed under the first material layer 430 is less than the width on the second direction D2 of the first material layer 430, and the detail thereof can be analogy to the relation between the second electrode layer 420 and the second electrode layer 420.

Generally, the interface between the semiconductor layer and the insulating layer easily captures electrons or holes, in which the physical phenomenon of the interface is similar to the physical phenomenon of the interface between the semiconductor layer and the insulating layer made of MOS. The threshold voltage of such MOS can be different depending on the applied electrical field. In addition, for such MOS structure, the threshold voltages before and after the irradiation are somehow different. When removing the irradiation, the depletion region of the semiconductor layer is not necessarily returned to the width before the irradiation. Therefore, at least to avoid the inconsistent widths of the depletion region before and after the irradiation, a positive bias is applied between the gate and the source of the MOS, which can increase the threshold voltage to resume the width of the depletion region to make the widths of the depletion region before and after the irradiation consistent.

Figure 5:
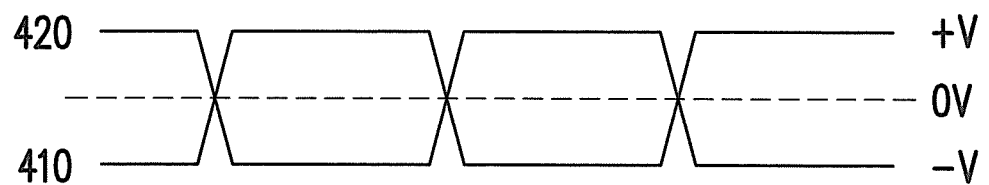
FIG. 5 is a schematic diagram showing the periodic polarity-reversal mode in which the first electrode layer and the second electrode layer in an embodiment of the invention.
Figure 6:
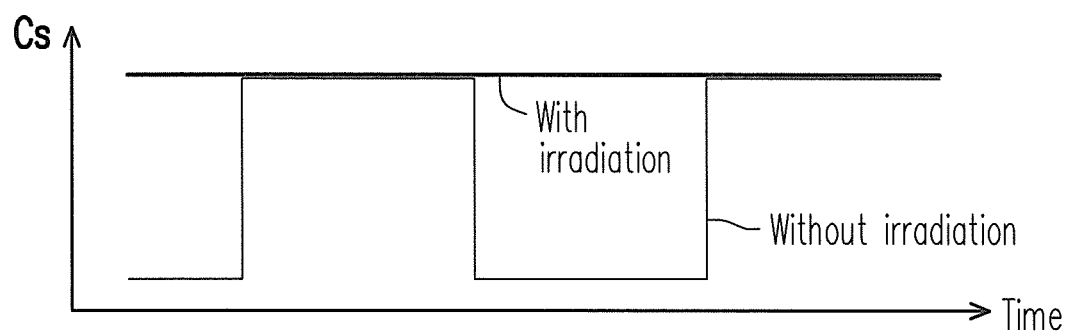
FIG. 6 is a schematic diagram showing the periodic variation of the capacitance of depletion region disappears according to an embodiment of the invention during an irradiation.

In the embodiment of FIG. 3 therefore, the first electrode layer 410 and the second electrode layer 420 receive an AC signal to be operated in a periodic polarity-reversal mode, as shown by FIG. 5. The AC signal herein means when the first electrode layer 410 is applied by a positive bias +V, the second electrode layer 420 is applied by a negative bias −V. On the contrary, when the first electrode layer 410 is applied by a negative bias −V, the second electrode layer 420 is applied by a positive bias +V. In the periodic polarity-reversal mode, the width of the depletion region of the second electrode layer 420 is maintained and not varied with the irradiation. In the angle of view of the capacitor Cs of the depletion region, the difference between with irradiation and without irradiation rests in that the periodic variation of the capacitor Cs of the depletion region disappears, as shown by FIG. 6.

Figure 7:
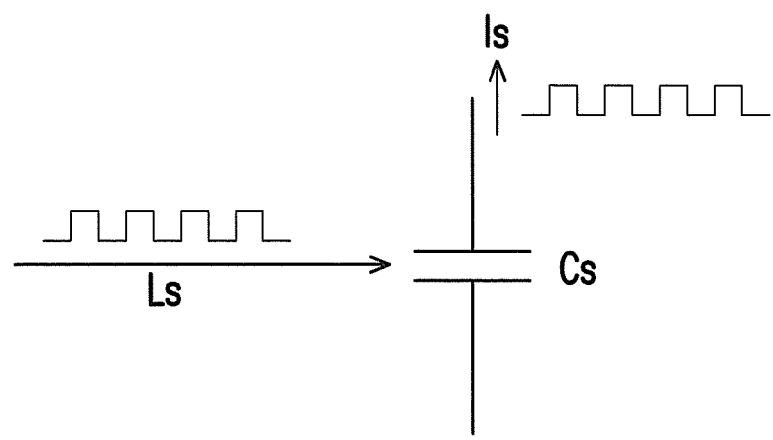
FIG. 7 is a schematic diagram showing that the capacitor of depletion region of the semiconductor layers according to an embodiment of the invention during an irradiation produces a displacement current due to the irradiation.

In the embodiment of the invention, to avoid misjudgement of the touch panel 100 on the non-triggering light in the optical touch mode the light signal of the light source of the touch panel 100 is with modulation. In more details, it should be noted that the capacitor Cs of the depletion region of the embodiment is more sensitive on the non-triggering light such as the light from the touch panel or the ambient. The modulation method of the signal of the light source in the embodiment is, for example, making the light source after the modulation has a flashing frequency f greater than the threshold value and thereby providing a corresponding light to irradiate the capacitor structure of the capacitive touch panel. The scheme is shown by FIG. 7, which shows that the capacitor Cs of depletion region of the semiconductor layers in an embodiment of the invention during an irradiation produces a displacement current. In FIG. 7, the capacitor Cs of the depletion region is irradiated by a light Ls with the flashing frequency f, wherein the flashing frequency f is greater than the threshold frequency for triggering the optical control. As a result, the capacitor Cs of the depletion region accordingly produces the displacement current Is with the same frequency for the touch panel 100 to read, which can avoid the misjudgement of the touch panel 100 on the non-triggering light in the optical touch mode.

In summary, the embodiments of the invention at least have one of the following advantages. The capacitive touch panel includes a semiconductor layer with both touch control functions of optical triggering and finger touch triggering. The voltage between the two electrodes of the touch panel can be periodically reversed to maintain the capacitance of the depletion region. In addition, in the optical touch mode, the triggering light can be modulated into the light with a specific frequency able to enhance the judgement capability on the signal of the touch panel. In this way, the capacitive touch panel of the disclosure has both the capacitive touch function and the optical touch function.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A capacitor structure of capacitive touch panel, comprising:
    a first electrode layer;
    a first material layer, disposed on the first electrode layer, wherein a material of the first material layer is selected from one of a semiconductor material and an insulating material;
    a second material layer, disposed on the first material layer, wherein a material of the second material layer s selected from another one of the semiconductor material and the insulating material; and
    a second electrode layer, disposed on the second material layer,
    wherein during an irradiation, a light source provides the capacitor structure with a light selected from one of a visible light and an ultraviolet light, and a flashing frequency of the light source is greater than a threshold frequency for triggering an optical control.

2. The capacitor structure of capacitive touch panel as claimed in claim 1, wherein the material of the second material layer is selected from semiconductor material and a width on a first direction of the second electrode layer disposed on the second material layer is less than a width on the first direction of the second material layer.

3. The capacitor structure of capacitive touch panel as claimed in claim 1, wherein the second electrode layer is arranged on a first direction.

4. The capacitor structure of capacitive touch panel as claimed in claim 1, wherein the material of the first material layer is selected from semiconductor material and a width on a second direction of the first electrode layer disposed under the first material layer is less than a width on the second direction of the first material layer.

5. The capacitor structure of capacitive touch panel as claimed in claim 4, wherein the first electrode layer is arranged on the second direction.

6. The capacitor structure of capacitive touch panel as claimed in claim 1, wherein the semiconductor material is a metal oxide semiconductor.

7. The capacitor structure of capacitive touch panel as claimed in claim 1, wherein during the irradiation, a capacitor of depletion region of the first material layer or second material layer made of semiconductor material is produced according to a bias of the capacitor structure.

8. The capacitor structure of capacitive touch panel as claimed in claim 1, wherein the first electrode layer and the second electrode layer are configured to receive an AC signal to be operated in a periodic polarity-reversal mode.

\* \* \* \* \*